United States Patent
Willey et al.

(10) Patent No.: US 8,648,635 B2
(45) Date of Patent: Feb. 11, 2014

(54) CLOCK SIGNAL GENERATORS HAVING A REDUCED POWER FEEDBACK CLOCK PATH AND METHODS FOR GENERATING CLOCKS

(71) Applicant: Micron Technology, Inc., Boise, ID (US)

(72) Inventors: Aaron Willey, Boise, ID (US); Yantao Ma, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/945,607

(22) Filed: Jul. 18, 2013

(65) Prior Publication Data

US 2013/0343134 A1    Dec. 26, 2013

Related U.S. Application Data

(60) Continuation of application No. 13/541,578, filed on Jul. 3, 2013, now Pat. No. 8,493,104, which is a division of application No. 12/757,597, filed on Apr. 9, 2010, now Pat. No. 8,461,889.

(51) Int. Cl.
  *H03L 7/06*    (2006.01)
(52) U.S. Cl.
  USPC .......................................... 327/158; 327/149
(58) Field of Classification Search
  USPC ................................................. 327/149, 158
  See application file for complete search history.

(56) References Cited

U.S. PATENT DOCUMENTS

| | | | |
|---|---|---|---|
| 5,614,855 A * | 3/1997 | Lee et al. ....................... | 327/158 |
| 6,225,863 B1 | 5/2001 | Miwa | |
| 6,445,228 B1 * | 9/2002 | Nguyen ......................... | 327/115 |
| 7,046,052 B1 * | 5/2006 | Percey et al. ................. | 327/115 |
| 7,148,726 B2 | 12/2006 | Oka et al. | |
| 7,183,824 B2 | 2/2007 | Park et al. | |
| 7,288,967 B2 | 10/2007 | Byun et al. | |
| 7,528,668 B2 | 5/2009 | Kim et al. | |
| 7,557,602 B2 | 7/2009 | Kim et al. | |
| 7,598,783 B2 * | 10/2009 | Shin et al. ..................... | 327/158 |
| 7,622,969 B2 | 11/2009 | Johnson | |
| 7,821,310 B2 * | 10/2010 | Yun et al. ...................... | 327/158 |
| 7,830,187 B2 | 11/2010 | Chung et al. | |
| 7,956,659 B2 | 6/2011 | You et al. | |
| 7,990,194 B2 * | 8/2011 | Shim ............................. | 327/158 |
| 8,461,889 B2 | 6/2013 | Willey et al. | |
| 8,493,104 B2 * | 7/2013 | Willey et al. .................. | 327/115 |
| 2003/0117194 A1 | 6/2003 | Lee | |
| 2004/0046596 A1 | 3/2004 | Kaeriyama et al. | |
| 2005/0127966 A1 | 6/2005 | Lee | |

(Continued)

*Primary Examiner* — Adam Houston
(74) *Attorney, Agent, or Firm* — Dorsey & Whitney LLP

(57) ABSTRACT

Memories, clock generators and methods for providing an output clock signal are disclosed. One such method includes delaying a buffered clock signal by an adjustable delay to provide an output clock signal, providing a feedback clock signal from the output clock signal, and adjusting a duty cycle of the buffered clock signal based at least in part on the feedback clock signal. An example clock generator includes a forward clock path configured to provide a delayed output clock signal from a clock driver circuit, and further includes a feedback clock path configured to provide a feedback clock signal based at least in part on the delayed output clock signal, for example, frequency dividing the delayed output clock signal. The feedback clock path further configured to control adjustment a duty cycle of the buffered input clock signal based at least in part on the feedback clock signal.

34 Claims, 10 Drawing Sheets

(56) References Cited

U.S. PATENT DOCUMENTS

| | | |
|---|---|---|
| 2005/0151565 A1 | 7/2005 | Oka et al. |
| 2006/0214689 A1 | 9/2006 | Byun et al. |
| 2007/0109058 A1 | 5/2007 | Kim et al. |
| 2007/0229164 A1 | 10/2007 | Lin et al. |
| 2008/0100355 A1 | 5/2008 | Omote |
| 2010/0052745 A1* | 3/2010 | Chung et al. .......... 327/149 |
| 2010/0117735 A1 | 5/2010 | Oelmaier |
| 2011/0018600 A1* | 1/2011 | Chung et al. .......... 327/158 |
| 2011/0234278 A1* | 9/2011 | Seo .......... 327/158 |
| 2011/0248752 A1* | 10/2011 | Willey et al. .......... 327/117 |
| 2012/0086488 A1 | 4/2012 | Willey |
| 2012/0268171 A1* | 10/2012 | Willey et al. .......... 327/117 |

* cited by examiner

CLOCK SIGNAL GENERATORS HAVING A REDUCED POWER FEEDBACK CLOCK PATH AND METHODS FOR GENERATING CLOCKS

CROSS-REFERENCE TO RELATED APPLICATION

This application is a continuation of U.S. patent application Ser. No. 13/541,578, filed Jul. 3, 2012, which application is a divisional of U.S. patent application Ser. No. 12/757,597, filed Apr. 9, 2010, and issued as U.S. Pat. No. 8,461,889 on Jun. 11, 2013. These applications and patent are incorporated by reference herein in their entirety and for any purpose.

TECHNICAL FIELD

Embodiments of the invention relate generally to clock signal generators, and more specifically, to clock signal generators having feedback clock paths.

BACKGROUND OF THE INVENTION

Clock signals are often used in electronic circuits for timing internal operation of various circuits necessary to execute an operation. For example, in synchronous memories, external clock signals are provided to the memory and internally distributed to different circuits of the circuit to carry out memory operations.

FIG. 1 illustrates a clock generator circuit 100 that includes a delay-locked loop (DLL) and duty-cycle correction (DCC) circuit. The DLL provides (e.g. generates) an output clock signal that is in phase with a reference input clock signal. The DCC circuit corrects a duty cycle distortion (i.e., duty cycle other than 50%) of the clock signal. The clock generator circuit 100 includes an input buffer circuit 104 that receives an input clock signal and buffers the same to provide a buffered input clock signal to a coarse delay line circuit 108. The delay of the coarse delay line circuit 108 can be adjusted to add delay to the buffered input clock signal. A fine delay line circuit 112 receives the coarsely delayed clock signal and can be adjusted to add finer delay. The coarsely and finely delayed clock signal is then provided to a DCC adjustment circuit 116 that alters the duty cycle of the clock signal to provide a duty cycle corrected clock signal. A static tOH trim circuit 120 coupled to the DCC adjustment circuit 116 provides tOH trim (i.e., to trim static duty cycle of the clock signal) to provide a tOH trimmed clock signal that is driven by a clock driver circuit 124 to provide an output clock signal.

The output clock signal is provided to a clock divider circuit 218 to provide a divided clock signal having a lower clock frequency than the output clock signal. A delay model 132 is coupled to receive the trimmed clock signal and add a model delay representing propagation delays between the input and output of the clock generator 100. A phase detector detects a phase difference between the model delayed clock signal and the output of the input buffer circuit 104. In response a phase difference signal is provided to a delay line control circuit 138, which provides delay control signals to set the adjustable delay of the coarse and fine delay lines 108, 112 to reduce the detected phase difference. The phase difference is reduced until the model delay clock signal and the buffered input clock signal are in phase.

A forward clock path of the clock generator circuit 100 includes the input buffer circuit 104, coarse and fine delay line circuits 108, 112, the clock driver circuit 124, the DCC adjustment circuit 116, the static tOH trim circuit 120 and the a clock driver circuit 124. Each of these circuits include transistor circuitry which introduce propagation delay to the clock signal, are susceptible to varying performance due to variations in operating and process conditions, and decrease responsiveness of the output clock signal to changes in coarse and fine delay. For example, the DCC adjustment circuit 116 may have 12 gates (i.e. transistors) when it is enabled to correct duty-cycle error, the static tOH trim circuit 120 may have 4 gates, and the clock driver circuit 124 may have 2 gates. A total of 18 gates are added after the fine delay line 112 to the forward path. Where clock stability and/or responsive performance are desired, a clock generator circuit presenting these problems in the forward clock path may be undesirable.

DETAILED DESCRIPTION

Certain details are set forth below to provide a sufficient understanding of embodiments of the invention. However, it will be clear to one skilled in the art that embodiments of the invention may be practiced without these particular details. Moreover, the particular embodiments of the present invention described herein are provided by way of example and should not be used to limit the scope of the invention to these particular embodiments. In other instances, well-known circuits, control signals, timing protocols, and software operations have not been shown in detail in order to avoid unnecessarily obscuring the invention.

Figure 1:
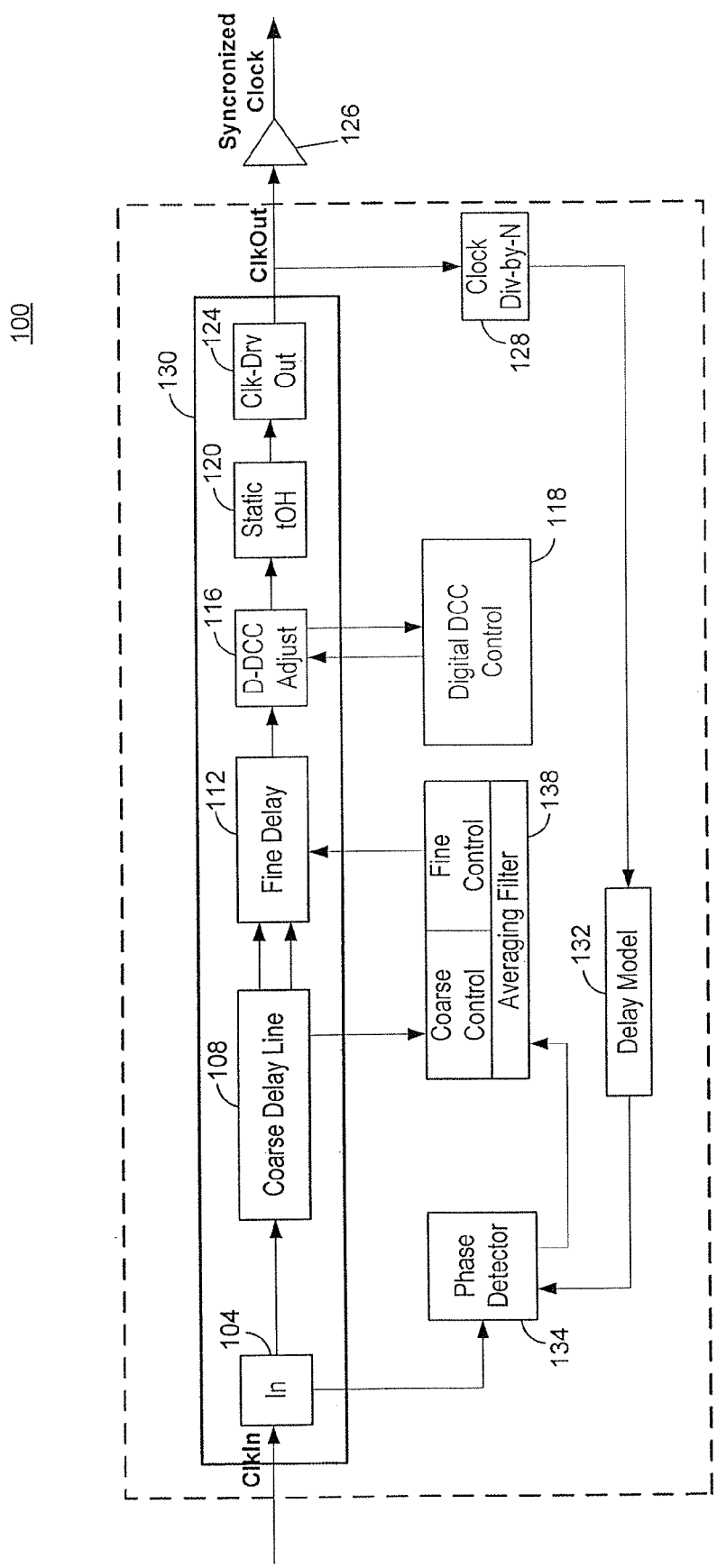
FIG. 1 is a block diagram of a conventional clock generator circuit.
Figure 2:
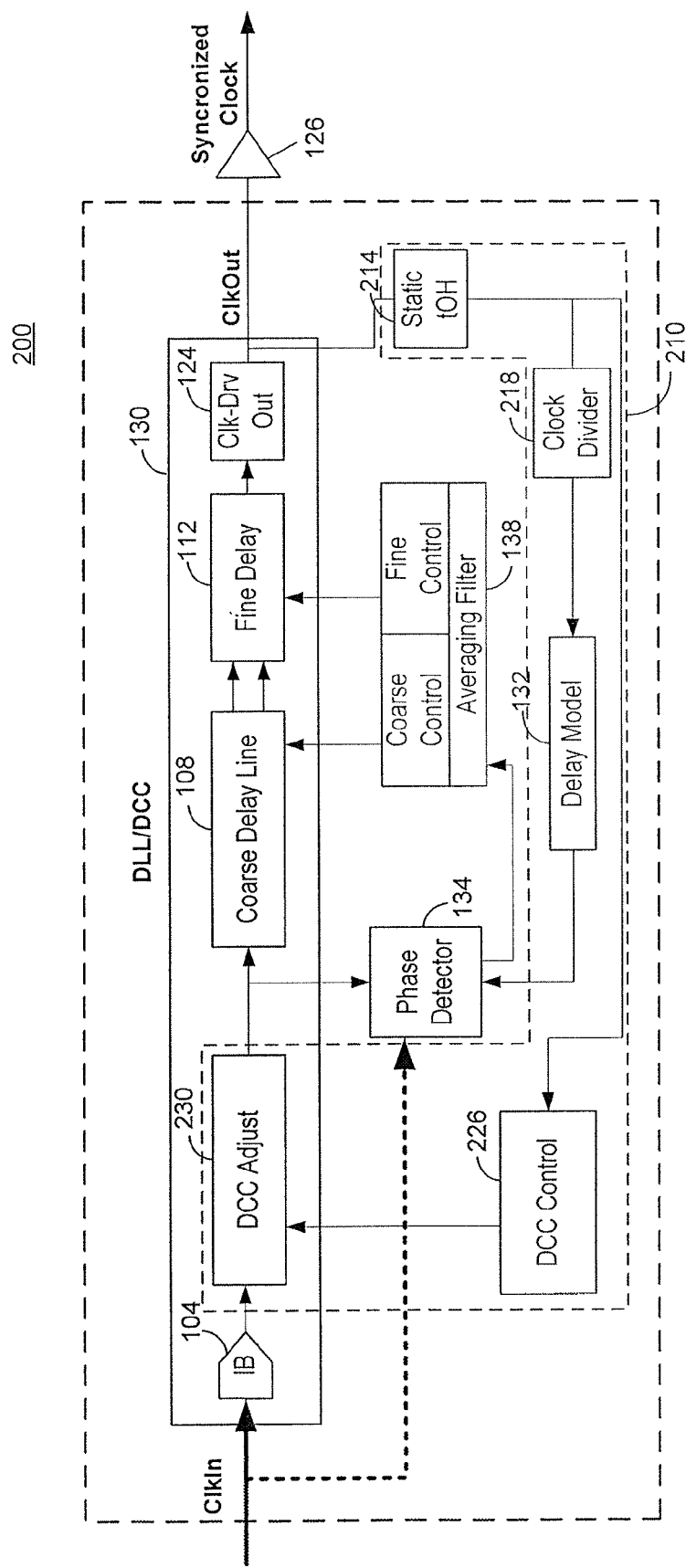
FIG. 2 is a block diagram of a clock generator circuit according to an embodiment of the invention.

FIG. 2 illustrates a clock generator circuit 200 according to an embodiment of the invention. The clock generator circuit 200 includes components previously described with reference to FIG. 1. For example, the clock generator circuit includes the input buffer circuit 104, coarse and fine delay line circuits 108 and 112, clock driver circuit 124, output buffer circuit 126, phase detector circuit 134, delay model 132, and delay line control circuit 138 as previously described with reference to the clock generator circuit 100. A forward clock path includes the input buffer circuit 104, coarse and fine delay line circuits 108, 112, and the clock driver circuit 124. More generally, a forward clock path refers to a portion of a DLL where a clock signal propagates forward from an input to the output of the DLL, and typically includes the adjustable delays and an output clock driver circuit. The clock generator circuit 200 further includes a feedback clock path 210 according to an embodiment of the invention. As will be described in more detail below, the feedback clock path 210 removes circuitry from the forward path of a DLL while also providing power savings benefits and DCC capability.

In the embodiment shown in FIG. 2, the feedback clock path 210 includes a static tOH trim circuit 214 coupled to the clock driver 124 to receive the delayed clock signal and provide tOH trim (i.e., to trim static duty cycle of the clock signal). The static tOH trim circuit 214 provides a trimmed clock signal to both a clock divider circuit 218 and to a DCC control circuit 226. A divided clock signal provided by the clock divider circuit 218 is delayed by a delay model 132, which models a delay of at least a portion of the forward path, for example, the propagation delays of the input buffer circuit 104 and the output buffer circuit 126. A model delayed clock signal is provided to the phase detector circuit 134 for phase comparison to the input clock signal to the coarse delay line circuit 108. Adjustment of the delay of the delay line circuits 108, 112 by delay line control circuit 138 based on a phase difference between the clock signals compared by the phase detector circuit 134 is as previously described with reference to the clock generator circuit 100.

The trimmed clock signal provided to the DCC control circuit 226 is used by DCC control circuit 226 to provide a control signal for DCC adjustment circuit 230 to correct duty cycle error. The DCC control circuit 226 receives the trimmed clock signal having the same frequency as the clock signal output by the clock generator circuit 200 (i.e., a "full-speed" clock signal, in contrast to the divided clock signal provided to the model delay circuit 132 having a lower frequency). In some embodiments, the DCC adjustment circuit 230 corrects duty cycle error by adjusting a clock driver circuit (not shown) to increase or decrease slew-rate of the clock signal provided to the coarse delay line circuit 108. In some embodiments, the DCC adjustment circuit 230 corrects duty cycle error by adjusting a trigger level for a clock driver circuit to trigger at a level that results in an output clock signal having an adjusted duty cycle. Other circuits for adjusting the duty-cycle of the clock signal may be used as well in other embodiments. In some embodiments, the DCC adjustment circuit 230 may be placed after the coarse delay line circuit 108 instead of before it.

In operation, the feedback clock path 210 provides static tOH trimming, DCC, and reduced power consumption compared to using only a feedback clock signal having the same frequency as a clock signal output by the clock generator circuit 200 by using clock division to provide the delay model circuit 132 with a lower frequency clock signal. The lower frequency clock signal causes fewer transitions of the phase detector circuit 134 circuitry, resulting in lower power consumption. Using a full-speed clock signal for the DCC may provide faster duty-cycle correction due to the greater number of clock transitions compared to a divided clock signal. Taken out of the forward clock path, the gate count in the forward clock path is reduced but nonetheless the feedback clock path 210 provides power savings and DCC. That is, the gate count attributed to an enabled DCC adjustment circuit and static tOH trim between the fine delay line 112 and the output are removed. Although gates are added into the forward clock path by the DCC adjustment circuit 230, the net number of in the forward clock path may be reduced. Having a lower gate count in the forward clock path may improve the responsiveness of the DLL obtaining a locked condition because the overall propagation delay of the clock signal to be output is reduced.

Figure 3:
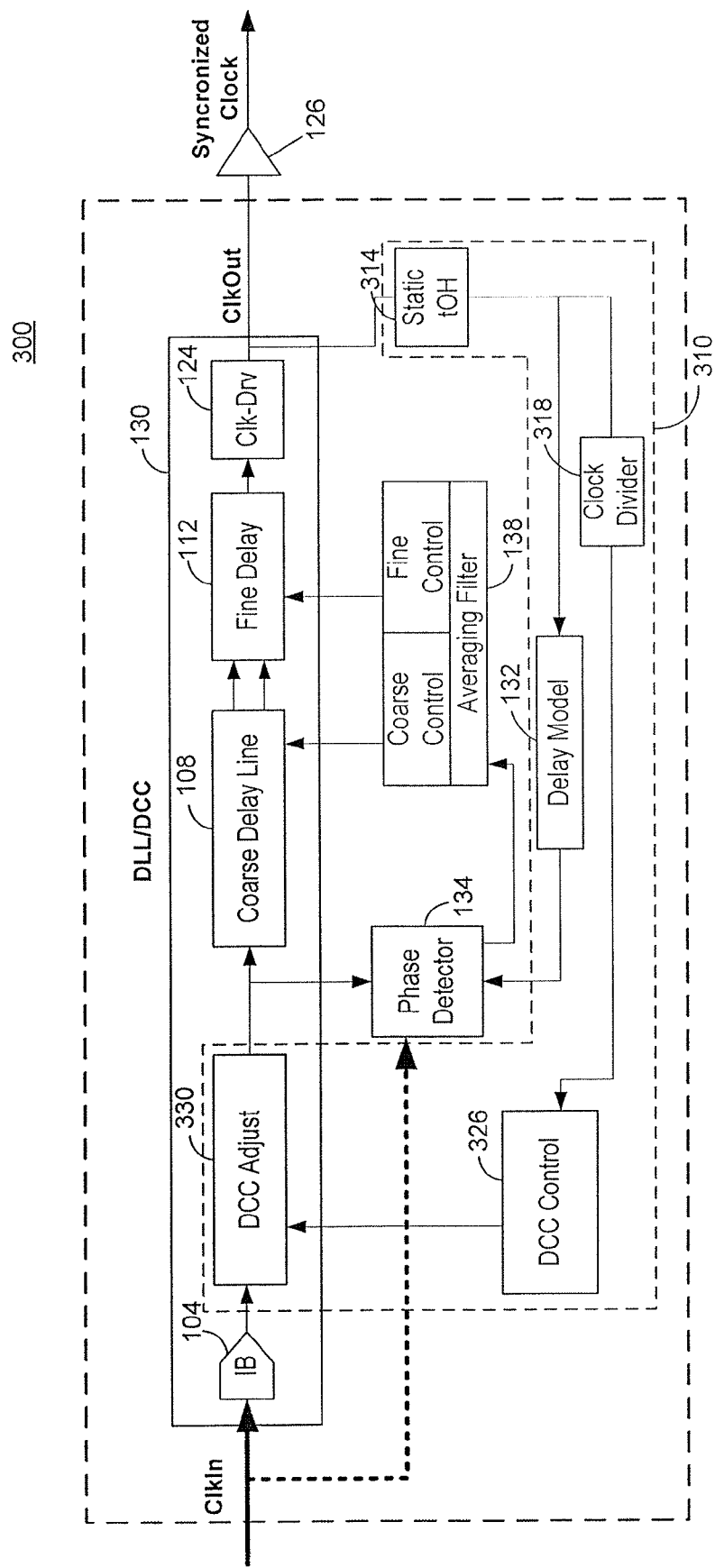
FIG. 3 is a block diagram of a clock generator circuit according to an embodiment of the invention.

FIG. 3 illustrates a clock generator circuit 300 according to an embodiment of the invention. In contrast to the clock generator circuit 200 of FIG. 2, the clock generator circuit 300 includes a feedback clock path 310. The feedback clock path 310 includes a static tOH trim circuit 314 coupled to the clock driver 124 to receive the delayed clock signal and provide tOH trim. The static tOH trim circuit 314 provides a trimmed clock signal to both the model delay 132 and a clock divider circuit 318. A divided clock signal provided by the clock divider circuit 318 is used by the DCC control circuit 326 to provide a control signal for DCC adjustment circuit 330 to correct duty cycle error.

In operation, the feedback clock path 310 provides static tOH trimming, DCC and reduced power consumption compared to using only a full-speed feedback clock signal. Reduced power consumption results from using a lower frequency clock signal for DCC. The lower frequency clock signal causes fewer transitions of the DCC control circuit 326 circuitry, resulting in lower power consumption. Providing a full-speed clock signal through the model delay 132 to the phase detector circuit 134 for phase detection may provide faster and more responsive delay adjustment of the coarse and fine delay lines 108, 112 due to the greater number of clock transitions compared to a lower frequency clock signal. Taken out of the forward clock path, the gate count in the forward clock path is reduced but the feedback clock path 210 nonetheless provides benefits of power savings and DCC.

Figure 4:
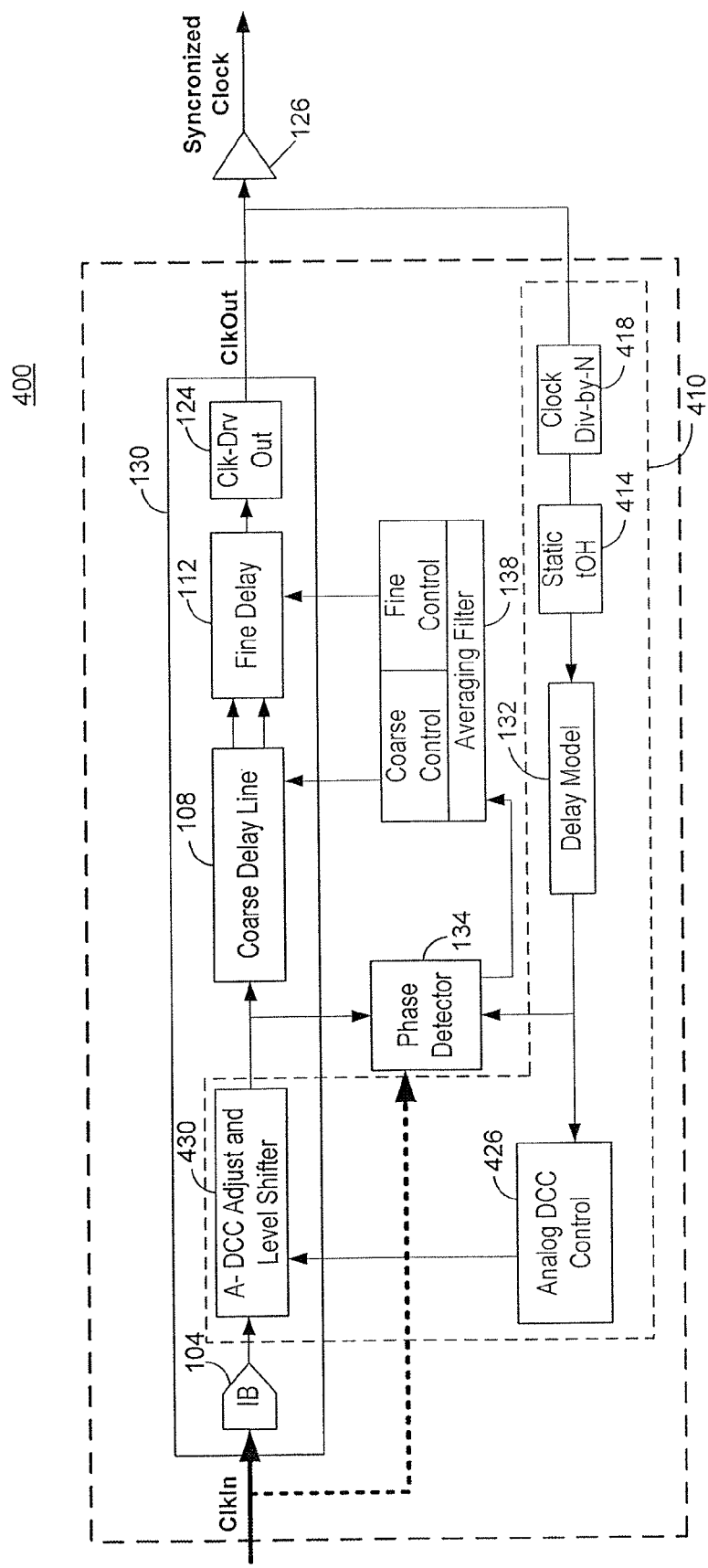
FIG. 4 is a block diagram of a clock generator circuit according to an embodiment of the invention.

FIG. 4 illustrates a clock generator circuit 400 according to an embodiment of the invention. In contrast to the clock generator circuits 200 and 300, the clock generator circuit 400 includes a feedback clock path 410. The feedback clock path 410 includes a clock divider circuit 418 coupled to the clock driver 124 to receive the delayed clock signal and provide a divided clock signal having a frequency lower than that output by the clock generator circuit 400. The divided clock signal is provided to a static tOH trim circuit 414 for tOH trimming. A tOH trimmed clock signal is provided to the model delay 132 which models a delay for at least a portion of the forward clock path. The delayed clock signal is provided to the phase detector circuit 134 for phase comparison to the input clock signal and adjustment of the delay of the delay line circuits 108, 112 by delay line control circuit 138. The delayed clock signal is further provided to the DCC control circuit 426 and is used to provide a control signal for DCC adjustment circuit 430 to correct duty cycle error.

In operation, the feedback clock path 410 provides tOH trimming, DCC and reduced power consumption compared to using only a full-speed feedback clock signal. Reduced power consumption results from using a lower frequency clock signal for tOH trimming, phase comparison (through the model delay circuit 132), and DCC.

Although a tOH trim circuit is shown in feedback clock paths 210, 310, and 410, other embodiments may not include a tOH trim circuit in the feedback clock path. The tOH trim circuit may be included in the forward clock path, for example, included in a DCC adjustment circuit that is in the forward clock path of a clock generator circuit. As such, the present invention should not be limited to embodiments having a tOH trim circuit included in a feedback clock path.

Figure 5:
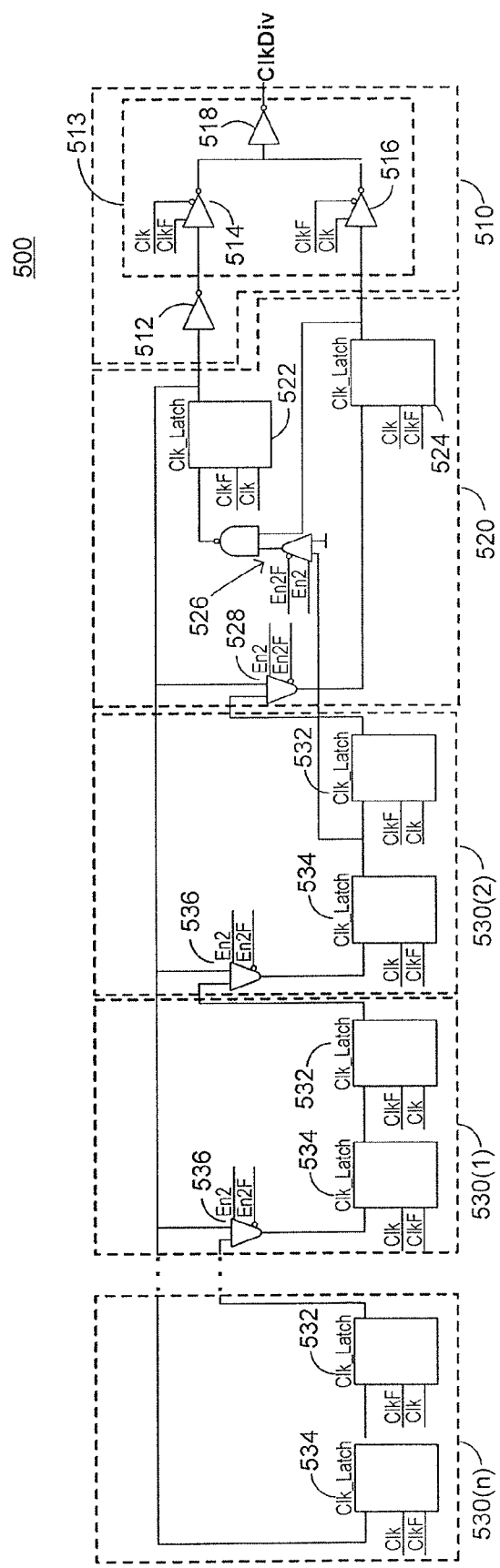
FIG. 5 is a block diagram of a clock divider circuit according to an embodiment of the invention.

FIG. 5 illustrates a clock divider circuit 500 according to an embodiment of the invention. In some embodiments, the clock divider circuit 500 is substituted for the clock divider circuits of clock generator circuits 200, 300, and 400. The clock divider circuit 500 receives an input clock signal Clk and its complement clock signal ClkF, and can be configured to provide an output clock signal ClkDivn having a frequency 1/n of the input clock signal.

The clock divider circuit 500 includes an output stage 510 and clock divider stages 520, 530(1)-530(n). The output stage 510 includes inverter 512 that provides an input to a clocked output driver 513. As shown in the embodiment of FIG. 5 the clocked output driver 513 includes two clocked inverters 514, 516 clocked by the Clk, ClkF signals, and an inverter 518. Each of the clocked inverters 514, 516 are active for a different phase of a clock cycle of the Clk, ClkF signal. That is, the clocked inverter 514 is active in response to LOW Clk and HIGH ClkF signals whereas the clocked inverter 516 is active in response to HIGH Clk and LOW ClkF signals. In this manner, either the inverted input of clocked inverter 514 or of clocked inverter 516 is driven to be the output clock signal ClkDivn. In other embodiments alternative output drivers may be used. The clock divider stage 520 includes latch circuits 522, 524 clocked by Clk, ClkF signals. The output of the latch circuit 522 may be fed back to the input of the latch circuit 524 through multiplexer 528, which is controlled by control signals Even, EvenF. Logic 526 couples the input of the latch circuit 522 to receive the complement of the output of the latch circuit 524 where n is even or to receive the logical combination of the output of the latch circuit 524 and a feed forward clock signal from a next clock divider stage 530(1) where n is odd. The clock divider stages 530(1)-(n) include latch circuits 532 and 534 clocked by Clk, ClkF signals and a multiplexer 536. A last clock divider stage 530(n), however, may not include the multiplexer so that a feedback clock signal is provided directly to the input of the latch circuit 534. The multiplexers 528, 536 are controlled by respective complementary control signals En2, En2F for clock divider stage 520, En34, En34F for clock divider stage 530(1), En56, En56F for clock divider stage 530(2) to configure the clock divider circuit 500 to divide the Clk signal by a desired n.

Figure 6A:
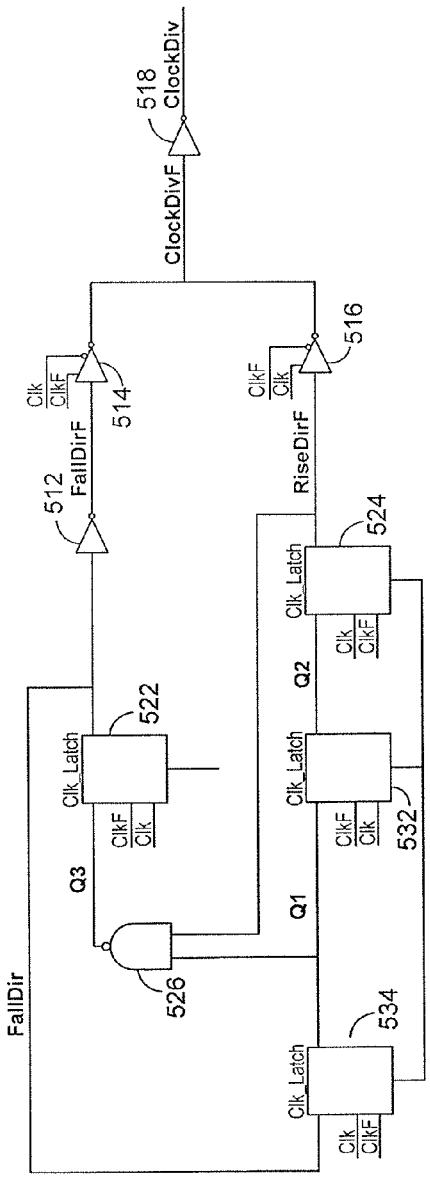
FIG. 6A is a block diagram of the clock divider circuit of FIG. 5 configured to divide a clock signal by 3.

FIG. 6A illustrates the clock divider circuit 500 configured to divide the Clk signal by 3. The clock divider circuit 500 is configured in the manner shown in FIG. 6A by having control signals En34, En34F set the multiplexer 536 of the clock divider stage 530(1) to feed back the output signal from the latch circuit 522 to the input of the latch circuit 534. The Even, EvenF signals are set for an odd n value (i.e., n=3) to feed the output of the latch circuit 534 forward to be combined in the logic 526 with the output of the latch circuit 524. As previously discussed, the latch circuits 522, 524, 532, 534 and the clocked inverters 514, 516 are clocked by the Clk, ClkF signals. Assuming that the latch circuits 522, 524, 532, 534 are falling edge latches, the logic level of an input signal is latched and output in response to a LOW level of a clock signal applied to a CLK node of the latch circuit.

In the configuration of FIG. 6A, the latch circuit 522 outputs a LOW logic level FallDir signal at T0, which in turn causes the latch circuit 534 to output a LOW Q1 signal in response to the LOW Clk signal at T1. The LOW Q1 signal causes the logic 526 to provide a HIGH Q3 signal. Upon a HIGH Clk signal at T2, the latch circuit 522 outputs a HIGH FallDir signal. The inverter 512 provides a LOW FallDirF signal in response, which is in turn inverted again and output by the clocked inverter 514 in response to the LOW Clk signal at T3. The inverter 518 inverts the HIGH signal into a LOW ClkDiv3 signal. As previously discussed, the LOW Q1 signal is output by the latch circuit 534 at T1. In response to the HIGH Clk signal at T2, the latch circuit 532 provides a LOW Q2 signal, which is then output by the latch circuit 524 as a LOW RiseDirF signal in response to the LOW Clk signal at T3. The clocked inverter 516 is not active, however, until the HIGH Clk signal at T4, at which time, the LOW RiseDirF signal output by the latch circuit 524 is inverted once and then again by the inverter 518 to maintain a LOW ClkDiv3 signal. Also at T3, as previously discussed the latch circuit 534 outputs a HIGH Q1 signal (in response to the HIGH FallDir signal), which is output as a HIGH Q2 signal at T4, and then output as a HIGH RiseDirF signal in response to the LOW Clk signal at T5. At T6 when the Clk signal transitions HIGH, the clocked inverter 516 is activated to provide a LOW ClkDiv3F signal, which is inverted to a HIGH ClkDiv signal.

At T5 when the HIGH RiseDirF signal is output by the latch circuit 524, the output Q3 provided by the logic 526 transitions LOW because both inputs (Q1 and RiseDirF) are HIGH logic levels. At the HIGH Clk signal at T6, the latch circuit 522 outputs a LOW FallDir signal to the latch circuit 534, which provides a LOW Q1 signal in response to the LOW Clk signal at T7. The LOW Q1 signal causes the logic 526 to provide a HIGH Q3 signal as well. At the HIGH Clk signal T8 the latch circuit 522 provides a HIGH FallDir signal due to the HIGH Q3 signal, which is inverted by the inverter 512 to provide a LOW FallDirF signal. In response to the LOW Clk signal at T9 the clocked inverter 514 is activated and provides a HIGH ClkDiv3F signal, which is then inverted into a LOW ClkDiv3 signal.

In summary, a falling edge of the ClkDiv3 signal occurs at T3, a rising edge occurs at T6, that is, 1½ clock cycles of the Clk signal, and a falling edge of the ClkDiv3 signal occurs at T9, which is 1½ clock cycles after the rising edge at T6. The resulting clock period of the ClkDiv3 signal is 3 clock cycles of the Clk signal and has a clock frequency ⅓ of the Clk signal. In general, the clock divider 500 is configured to insert half-clock cycles of the Clk signal using the latch circuits of the clock divider stages 520, 530(1)-(n) (depending on the desired n) to extend the period of the RiseDirF signal and provide a phase relationship between the FallDirF and RiseDirF signals to have the falling edges of the FallDirF signal spaced evenly between the rising edges of the RiseDirF signals.

Figure 6C:
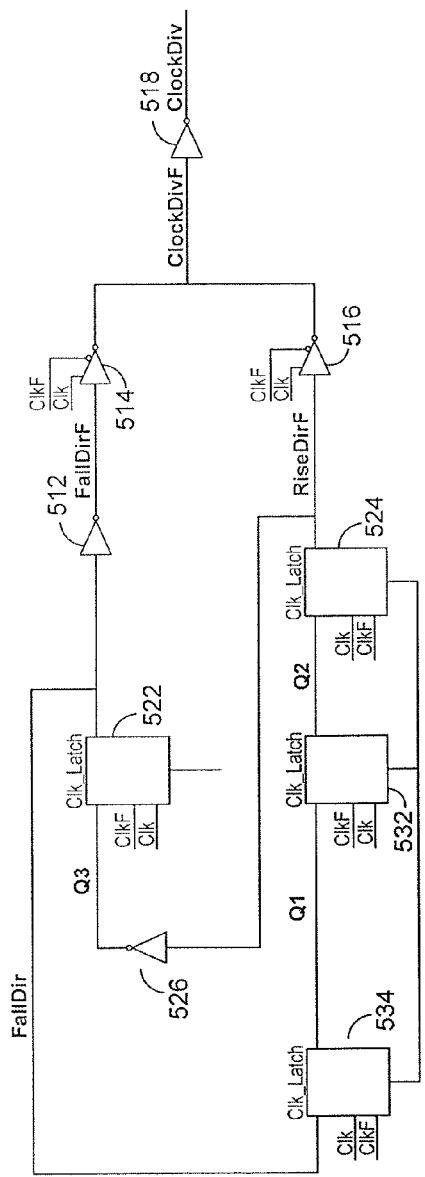
FIG. 6C is a timing diagram of various signals during operation of the clock divider circuit configured as illustrated in FIG. 6A.
Figure 6B:
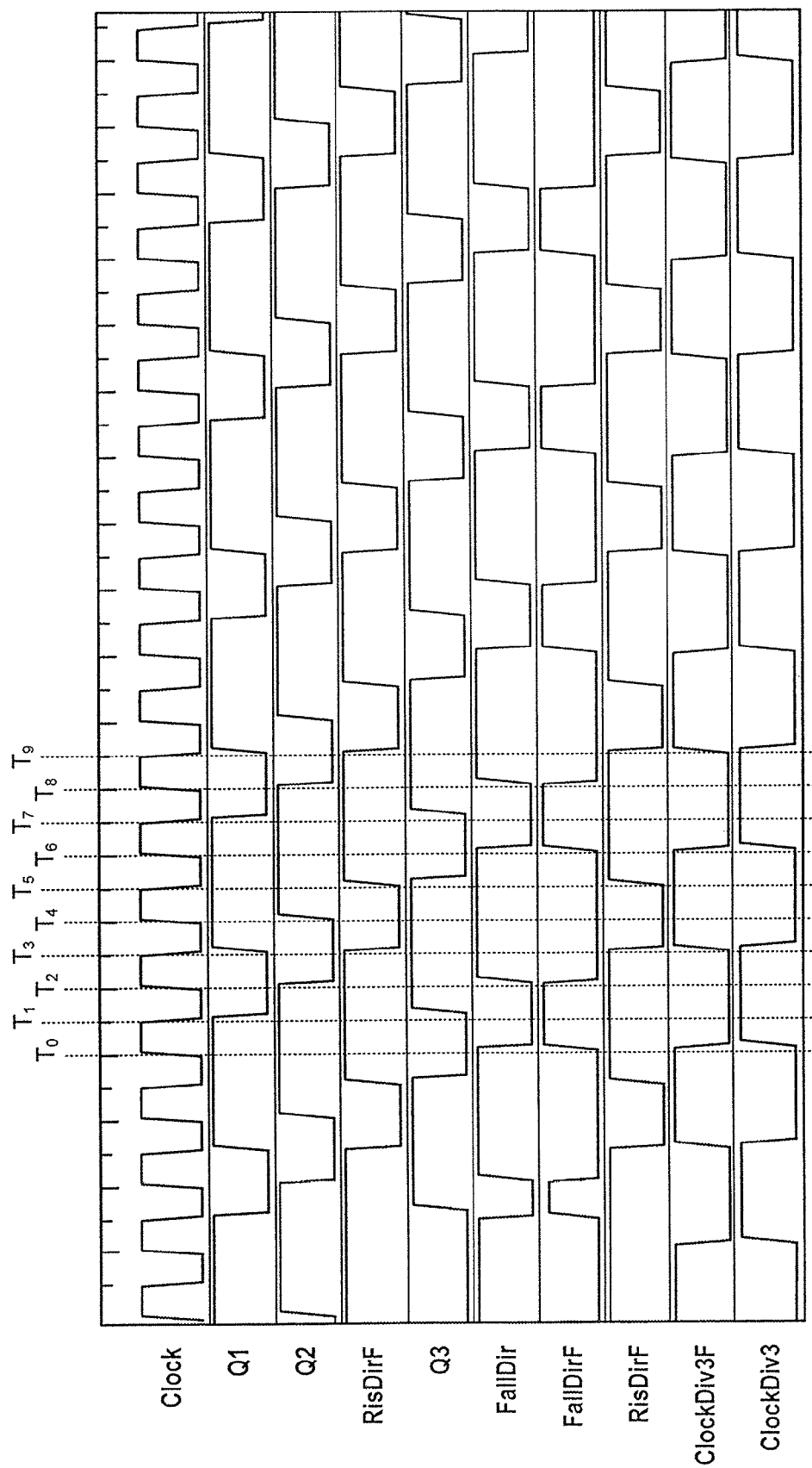
FIG. 6B is a block diagram of the clock divider circuit of FIG. 5 configured to divide a clock signal by 4.

FIG. 6C illustrates the clock divider circuit 500 configured to divide the Clk signal by 4. With reference to FIG. 5, the clock divider circuit 500 is configured in the manner shown in FIG. 6C by having control signals En34, En34F set the multiplexer 536 of the clock divider stage 530(1) to feed back the output signal from the latch circuit 522 to the input of the latch circuit 534. The Even, EvenF signals are set for an even value (i.e., n=4) so that the logic 526 behaves as an inverter for the output of the latch circuit 524.

Operation of the clock divider circuit 500 of FIG. 6C is similar to that as previously described with reference to FIG. 6A, except that the input to the latch circuit 522 is based only on the output from the latch circuit 524. For example, a HIGH FallDir signal output by the latch circuit 522 in response to a HIGH Clk signal causes a falling edge of the ClkDiv4 signal in response to a LOW Clk signal. Two clock cycles of the Clk signal elapse before the HIGH FallDir signal propagates through latch circuits 534, 532, 524, and the clocked inverter 516, and causes a rising edge of the ClkDiv4 signal. With the output of the latch circuit 522 relying only on the output of the latch circuit 524, another two clock cycles elapses before another falling edge of the ClkDiv4 signal results from the next HIGH FallDir signal. As a result, the period of the ClkDiv4 signal is 4-clock cycles of the Clk signal and has a clock frequency ¼ the Clk signal.

As illustrated by the previous examples, the clock divider circuit 500 can be configured to divide clock signals by both even and odd values of n. Moreover, for odd values of n, the duty cycle error of the ClkDivn signal is 1/n of the duty cycle error of the input Clk signal.

Figure 7:
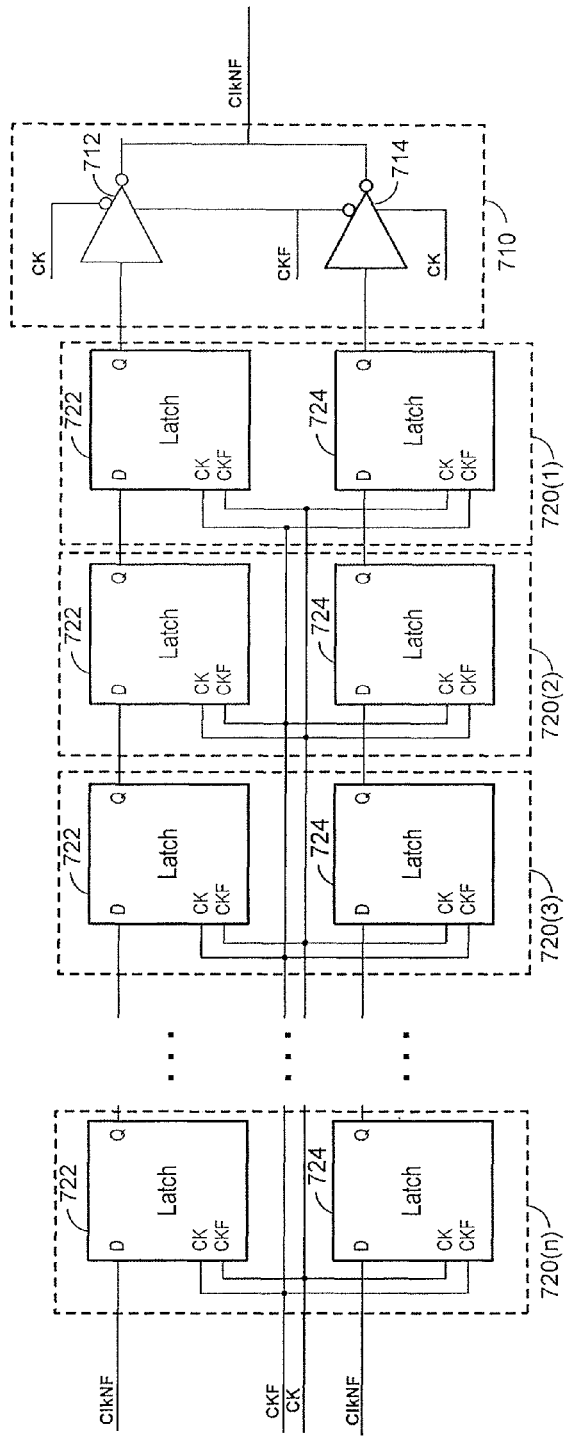
FIG. 7 is a block diagram of a clock divider circuit according to an embodiment of the invention.

FIG. 7 illustrates a clock divider circuit 700 according to an embodiment of the invention. In some embodiments, the clock divider circuit 700 is substituted for the clock divider circuits of clock generator circuits 200, 300, and 400. The clock divider circuit 700 includes an output stage 710 and a plurality of clock divider stages 720(1)-720(n). The output stage 710 includes clocked inverters 712 and 714, each of which is active for a different phase of a clock cycle of the Clk, ClkF signal. In this manner, either the inverted input of clocked inverter 712 or of clocked inverter 714 is driven to be the output clock signal ClknF. Each of the clock divider stages 720(1)-720(n) includes latch circuits 722 and 724, both clocked by the Clk, ClkF signals. Inputs of the latch circuits are coupled to receive an output from a previous clock divider stage, or if a first clock divider stage, to receive the ClknF signal output by the output stage 710. The clock divider circuit 700 can be configured to divide the Clk frequency by both even and odd n values. Also, the duty cycle error of the ClknF signal is 1/n of the duty cycle error of the input Clk signal of odd values of n. As will be describe in more detail below, the clock divider circuit 700 provides a ClknF signal having a frequency of 1/n of the Clk signal by using n clock divider stages 720.

Figure 8A:
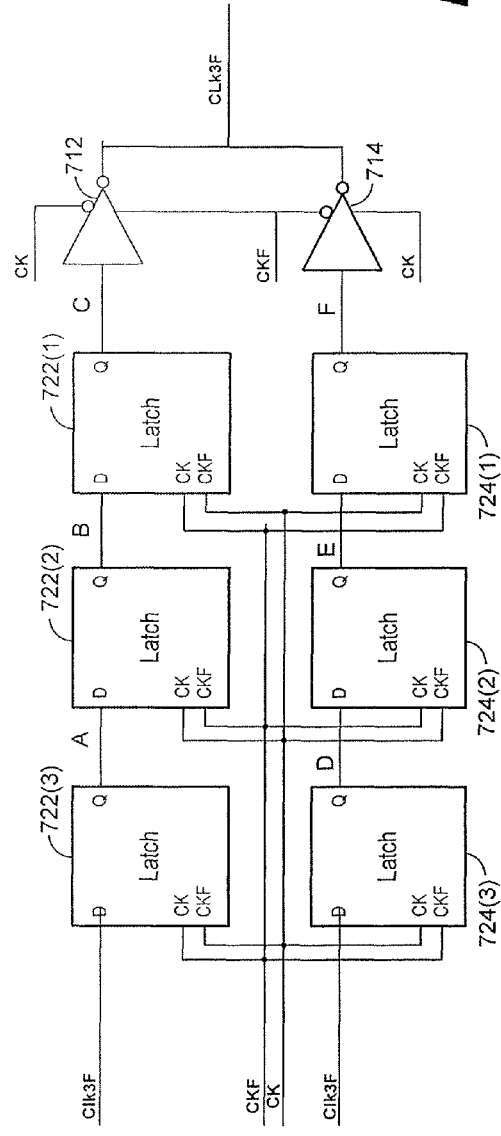
FIG. 8A is a block diagram of the clock divider circuit of FIG. 7 configured to divide a clock signal by 3.
Figure 8B:
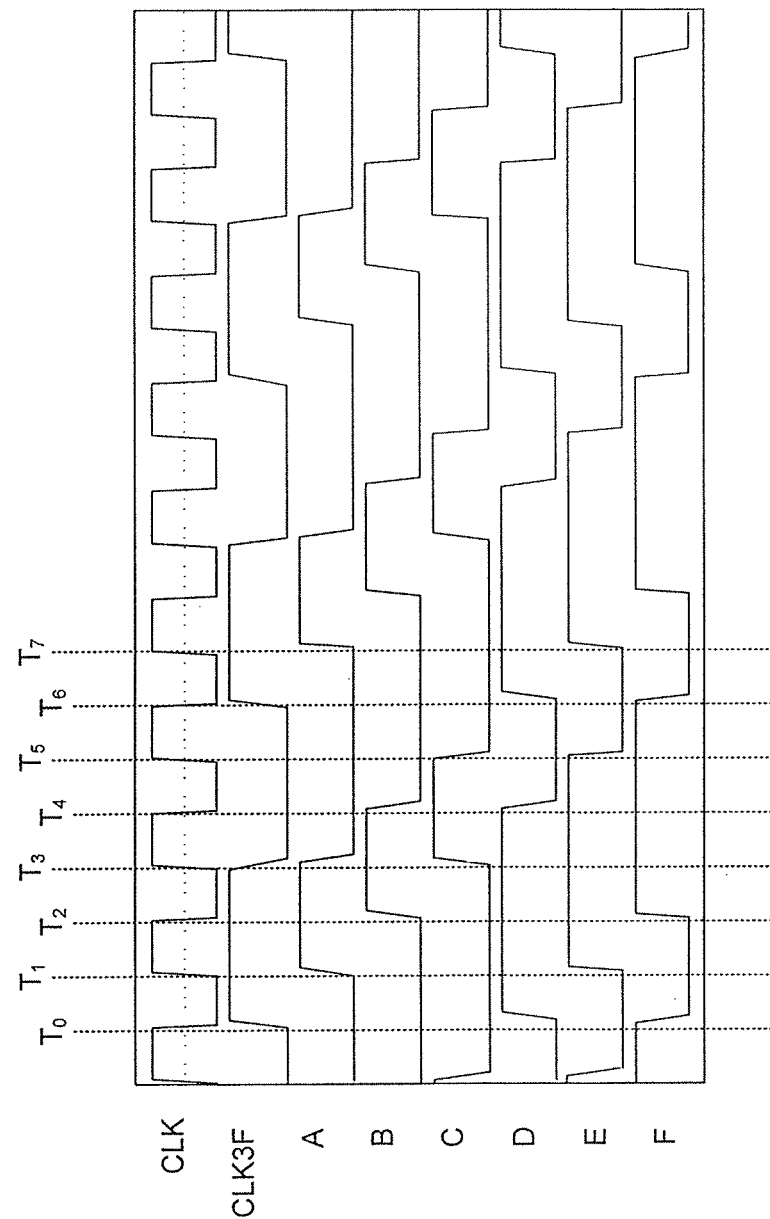
FIG. 8B is a timing diagram of various signals during operation of the clock divider circuit configured as illustrated in FIG. 8A

Operation of the clock divider circuit 700 will be described with reference to FIG. 8A, which is an embodiment configured to divide the Clk signal by 3, and the timing diagram of FIG. 8B. At time T0, the Clk3F signal transitions HIGH and is latched by the LOW Clk signal at T0 by latch circuit 724(3) and then by the HIGH Clk signal at T1 by latch circuit 722(3). Also at T1, the latch circuit 724(2) latches the HIGH output from latch circuit 724(3), which is then latched in response to the LOW Clk signal at T2 and output to the clocked inverter 714 by the latch circuit 724(1). With the Clk signal LOW, however, the clocked inverter 714 is inactive and thus the Clk3F signals continues to be HIGH. The HIGH Clk3F signal continues to propagate through latch circuits 722(2) and 722(1) to the clocked inverter 712 in response to the LOW Clk signal at T2 and the HIGH Clk signal at T3, respectively. With the Clk signal HIGH at T3, the clocked inverter 712 is inactive. However, the clocked inverter 714 becomes active, inverting the HIGH output from the latch circuit 724(1) at T3 to a falling edge of the Clk3F signal.

The LOW Clk3F signal is fedback and latched by latch circuits 722(3) and 724(3) in response to the HIGH Clk signal at T3 and in response to the LOW Clk signal at T4, respectively. The LOW Clk3F signal propagates through the latch circuits 724(2) and 724(1) in response to the HIGH Clk signal at T5 and then the LOW Clk signal at T6. The LOW Clk3F signal similarly propagates through the latch circuits 722(2) and 722(1) at T4 and T5, respectively. With the Clk signal LOW at T6, the clocked inverter 714 is inactive but the clocked inverter 712 is active, inverting the output from the latch circuit 722(1) into a rising edge of the Clk3F signal. As at T0 and T1, the rising edge of Clk3F is feedback to be latched by the latch circuits 724(3) and 722(3) at T6 and T7, respectively.

As illustrated by the previously described example of dividing the Clk signal by 3, the output clock signal ClknF is fedback to be propagated through the n clock divider stages 720 in accordance with the Clk signal. As a result, the number of clock divider stages 720 through which the output clock signal propagates corresponds to the number of half clock cycles of the Clk signal for a half period of the output clock signal ClknF. As the fedback output clock signal propagates through the clock divider stages 720, the output stage switches back and forth between inverting the output of the latch circuit 722(1) and the latch circuit 724(1) in accordance with the Clk, ClkF signals to provide the level of the ClknF signal. The rising and falling edges of the ClknF signal result from the transitions of the fedback output clock signal propagating through to the output stage 710.

Figure 9:
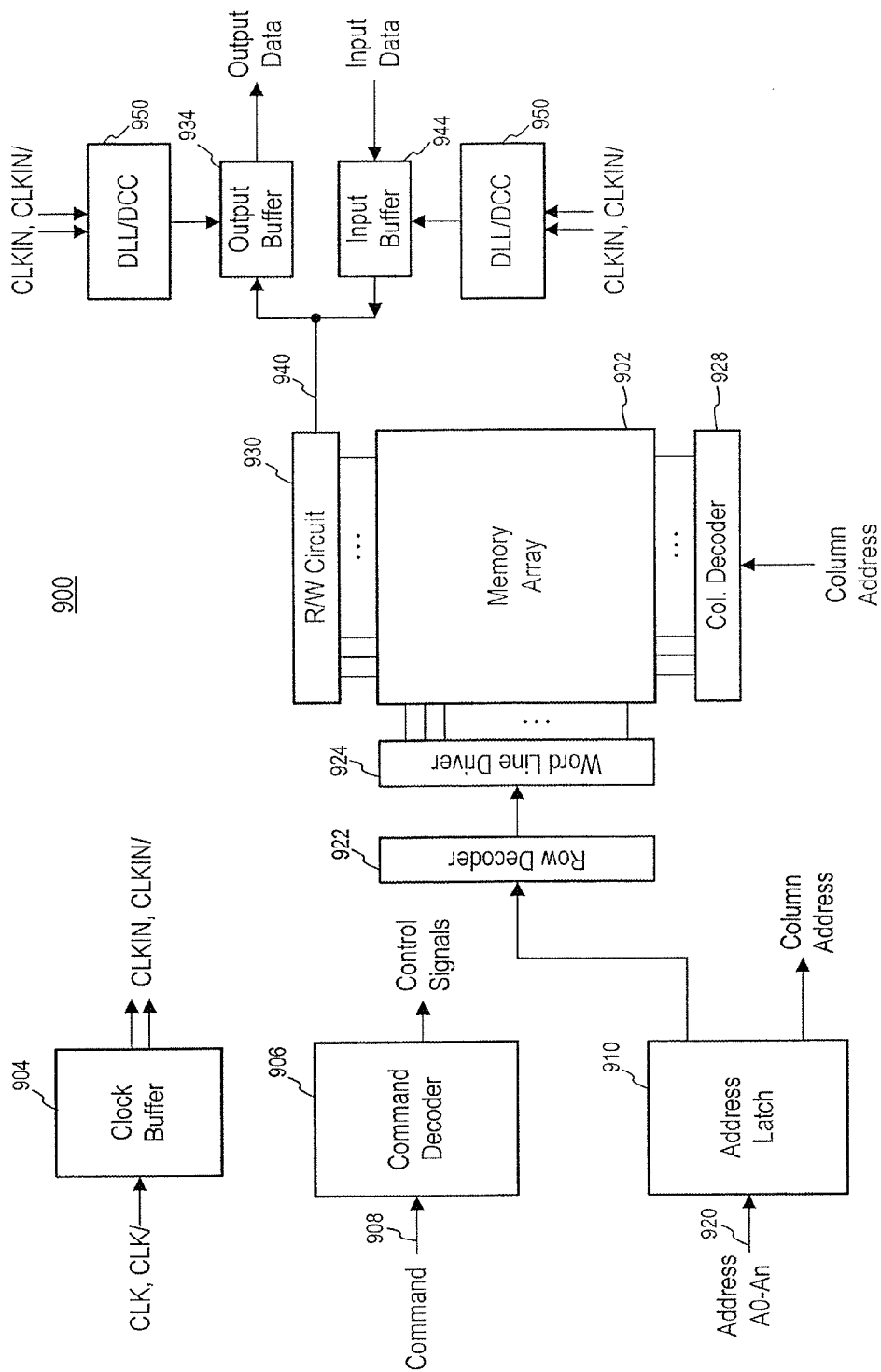
FIG. 9 is a block diagram of a memory including a current amplifier according to an embodiment of the invention.

FIG. 9 illustrates a portion of a memory 900 according to an embodiment of the present invention. The memory 900 includes an array 902 of memory cells, which may be, for example, volatile memory cells, non-volatile memory cells, DRAM memory cells, SRAM memory cells, flash memory cells, or some other types of memory cells. The memory 900 includes a command decoder 906 that receives memory commands through a command bus 908 and provides corresponding control signals within the memory 900 to carry out various memory operations. A clock buffer 904 receives external clock signals CLK, CLK/ and provides internal clock signals CLKIN, CLKIN/ that are used for internal timing of the memory 900. Row and column address signals are applied to the memory 900 through an address bus 920 and provided to an address latch 910. The address latch then outputs a separate column address and a separate row address.

The row and column addresses are provided by the address latch 910 to a row address decoder 922 and a column address decoder 928, respectively. The column address decoder 928 selects bit lines extending through the array 902 corresponding to respective column addresses. The row address decoder 922 is connected to word line driver 924 that activates respective rows of memory cells in the array 902 corresponding to received row addresses. The selected data line (e.g., a bit line or bit lines) corresponding to a received column address are coupled to a read/write circuitry 930 to provide read data to a data output buffer 934 via an input-output data bus 940. Write data are applied to the memory array 902 through a data input buffer 944 and the memory array read/write circuitry 930.

The memory 900 includes clock generator circuits 950 that provide duty-cycle corrected clock signals to the output buffer 934 and the input buffer 944. The clock generator circuits may be implemented by a clock generator circuit according to an embodiment of the invention, for example, the clock generator circuits 200, 300, 400 previously described. The clock generator circuits 950 receive the CLKIN, CLKINF signals and provide output clock signals having corrected duty cycles. The output clock signals are provided to the output and input buffers 734, 744 to clock the respective buffers to output and input data. Clock generator circuits according to embodiments of the invention may be included in the memory 900 for other applications as well. The command decoder 906 responds to memory commands applied to the command bus 908 to perform various operations on the memory array 902. In particular, the command decoder 906 is used to provide internal control signals to read data from and write data to the memory array 902.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:
1. An apparatus, comprising:
a memory array;
a read/write circuit coupled to the memory array and configured to read data from and write data to the memory array;

a buffer coupled to the read/write circuit and configured to be clocked according to an output clock signal; and a clock generator circuit coupled to the buffer and configured to provide the output clock signal, the clock generator circuit comprising:

a forward clock path configured to delay an input clock signal by an adjustable delay adjusted based at least in part on a feedback clock signal and further configured to provide the output clock signal;

a duty cycle correction circuit configured to adjust a duty cycle of a clock signal of the forward clock path based at least in part on a duty cycle control signal; and a feedback clock path coupled to the forward clock path and configured to receive the output clock signal, the feedback clock path configured to provide a first feedback clock signal having a frequency lower than a frequency of the output clock signal and on which the adjustable delay of the forward clock path is based at least in part, and the feedback clock path further configured to provide a second feedback clock signal based at least in part on the output clock signal and having a same clock frequency as the output clock signal and configured to provide the duty cycle control signal to the duty cycle correction circuit, the duty cycle control signal based at least in part on the second feedback clock signal.

2. The apparatus of claim 1, wherein the feedback clock path comprises a first feedback path configured to provide the first feedback clock signal and a second feedback path configured to provide the second feedback clock signal.

3. The apparatus of claim 1, wherein the forward clock path comprises a coarse delay line circuit and a fine delay line circuit, each configured to provide a respective delay to delay the input clock signal by the adjustable delay.

4. The apparatus of claim 1, wherein the feedback clock path is further configured to delay the first feedback clock signal based, at least in part, on a propagation delay.

5. The apparatus of claim 1, wherein the feedback clock path is configured to adjust the duty cycle of the input clock signal by adjusting a slew rate of the input clock signal.

6. The apparatus of claim 1, wherein the feedback clock path configured to provide a first feedback clock signal having a frequency lower than a frequency of the output clock signal comprises the feedback clock path configured to divide the output clock signal to provide the first feedback clock signal.

7. The apparatus of claim 6, wherein the feedback clock path is configured to divide the output clock signal by an even value.

8. The apparatus of claim 7, wherein the even value is 4.

9. The apparatus of claim 1, wherein the forward clock path includes a coarse delay line circuit and wherein the duty cycle correction circuit is placed after the coarse delay line circuit.

10. An apparatus, comprising:

a first signal path configured to delay an input clock signal to provide a delayed clock signal, the delay based, at least in part, on a feedback clock signal;

a second signal path configured to receive the delayed clock signal and to provide the feedback clock signal, the feedback clock signal based, at least in part, on the delayed clock signal, wherein the feedback clock signal has a different frequency than the delayed clock signal; and a third signal path configured to receive the delayed clock signal and to provide a control signal to adjust a duty cycle of a clock signal of the first signal path, the control signal based, at least in part, on the delayed clock signal.

11. The apparatus of claim 10, further comprising a phase detector configured to receive the input clock signal and the feedback clock signal, and further configured to provide a phase difference signal indicative of the phase difference between the input clock signal and the feedback clock signal.

12. The apparatus of claim 10, further comprising:

a memory array;

a read/write circuit coupled to the memory array and configured to read data from and write data to the memory array; and a buffer coupled to the read/write circuit and configured to receive the delayed clock signal, the buffer further configured to be clocked according to the delayed clock signal.

13. The apparatus of claim 10, further comprising a duty cycle correction circuit coupled to the first signal path and configured to adjust the duty cycle of the clock signal of the first signal path based, at least in part, on the control signal, wherein the first signal path includes a coarse delay line circuit and wherein the duty cycle correction circuit is placed after the coarse delay line circuit.

14. The apparatus of claim 10, wherein the second signal path includes a delay configured to provide a delay to the feedback clock signal relative to the delayed clock signal.

15. The apparatus of claim 10, wherein a second signal path configured to receive the delayed clock signal and to provide the feedback clock signal comprises the second signal path configured to divide the delayed clock signal to provide the feedback clock signal.

16. The apparatus of claim 15, wherein the second signal path is configured to divide the delayed clock signal by an even value.

17. The apparatus of claim 16, wherein the even value comprises 4.

18. An apparatus, comprising:

a forward path configured to operate according to a first clock frequency and to delay an input clock signal based, at least in part, on a delay clock signal to provide an output clock signal; and a feedback path configured to operate according to a second clock frequency and to receive the output clock signal, the feedback path further configured to provide the delay clock signal and a duty cycle correction control signal based, at least in part, on the output clock signal and to adjust a duty cycle of a clock signal of the forward path according to the duty cycle correction control signal.

19. The apparatus of claim 18, wherein the feedback path is further configured to operate according to the first clock frequency.

20. The apparatus of claim 18, wherein the feedback path is configured to provide one of the delay clock signal and the duty cycle correction control signal according to the first clock frequency and to provide another of the delay clock signal and the duty cycle correction control signal according to the second clock frequency.

21. The apparatus of claim 18, wherein the first clock frequency is based, at least in part, on the input clock signal.

22. The apparatus of claim 21, wherein the second clock frequency is based, at least in part, on the first clock frequency.

23. The apparatus of claim 22, wherein the first clock frequency is based on a first clock and the second clock frequency is based on a second clock, wherein the feedback path is configured to provide the second clock responsive, at least in part, to dividing the first clock.

24. The apparatus of claim 23, wherein the feedback path is configured to divide the first clock by an even value.

25. The apparatus of claim 24, wherein the even value comprises 4.

26. The apparatus of claim 18, further comprising a duty cycle correction circuit configured to receive the duty cycle correction control signal, the duty cycle correction circuit further configured to adjust the duty cycle the clock signal of the forward path based, at least in part, on the duty cycle correction control signal, wherein the forward path includes a coarse delay line circuit and wherein the duty cycle correction circuit is placed after the coarse delay line circuit.

27. A method, comprising:
   delaying an input signal with a forward path according to a feedback signal to provide an output signal;
   providing the output signal to a first feedback path and a second feedback path;
   providing the feedback signal with the first feedback path, the feedback signal based, at least in part, on the output signal;
   adjusting a duty cycle of a clock signal of the forward path according to a control signal provided by the second feedback path, the control signal based, at least in part, on the output signal; and
   providing data from a buffer according to the output signal.

28. The method of claim 27, wherein providing the output signal to first and second feedback paths comprises trimming the output signal with a trim circuit.

29. The method of claim 27, wherein providing the feedback signal with the first feedback path comprises dividing the output signal with a clock divider.

30. The method of claim 29, wherein dividing the output signal with a clock divider comprises dividing the output signal by an even value.

31. The method of claim 30, wherein dividing the output signal by an even value comprises dividing the output signal by 4.

32. The method of claim 27, wherein delaying an input signal with a forward path comprises delaying the input signal with a coarse delay and a fine delay.

33. The method of claim 27, wherein providing the feedback signal with the first feedback path comprises trimming a static duty cycle of the output signal.

34. The method of claim 27, wherein adjusting a duty cycle of a clock signal of the forward path according to a control signal provided by the second feedback path comprises adjusting the duty cycle of the clock signal with a duty cycle correction circuit, wherein the forward path includes a coarse delay line circuit and wherein the duty cycle correction circuit is placed after the coarse delay line circuit.

* * * * *

UNITED STATES PATENT AND TRADEMARK OFFICE
CERTIFICATE OF CORRECTION

| | | |
|---|---|---|
| PATENT NO. | : 8,648,635 B2 | Page 1 of 1 |
| APPLICATION NO. | : 13/945607 | |
| DATED | : February 11, 2014 | |
| INVENTOR(S) | : Aaron Willey et al. | |

It is certified that error appears in the above-identified patent and that said Letters Patent is hereby corrected as shown below:

On the title page, item (60), in column 1, line 2,
delete "Jul. 3, 2013," and insert -- Jul. 3, 2012, --, therefor.

In the Claims:
In column 11, line 8, in Claim 26, before "the" insert -- of --.

Signed and Sealed this
Thirteenth Day of May, 2014

Michelle K. Lee
*Deputy Director of the United States Patent and Trademark Office*